US009166074B2

(12) United States Patent
Dasgupta et al.

(10) Patent No.: US 9,166,074 B2
(45) Date of Patent: Oct. 20, 2015

(54) METAL SILICIDE NANOWIRE ARRAYS FOR ANTI-REFLECTIVE ELECTRODES IN PHOTOVOLTAICS

(71) Applicants: The Board of Trustees of the Leland Stanford Junior University, Palo Alto, CA (US); Honda Motor Co., LTD, Tokyo (JP)

(72) Inventors: Neil Dasgupta, San Francisco, CA (US); Hee Joon Jung, Palo Alto, CA (US); Andrei Iancu, Stanford, CA (US); Rainer J. Fasching, Mill Valley, CA (US); Friedrich B. Prinz, Woodside, CA (US); Hitoshi Iwadate, Palo Alto, CA (US); Shicheng Xu, Stanford, CA (US)

(73) Assignees: The Board of Trustees of the Leland Stanford Junior University, Palo Alto, CA (US); Honda Motor Co., LTD., Tokyo (JP)

( * ) Notice: Subject to any disclaimer, the term of this patent is extended or adjusted under 35 U.S.C. 154(b) by 144 days.

(21) Appl. No.: 13/709,430

(22) Filed: Dec. 10, 2012

(65) Prior Publication Data
US 2013/0149860 A1 Jun. 13, 2013

Related U.S. Application Data

(60) Provisional application No. 61/630,348, filed on Dec. 9, 2011.

(51) Int. Cl.
*H01L 31/0224* (2006.01)
*H01L 31/0216* (2014.01)
*B82Y 40/00* (2011.01)
*B82Y 30/00* (2011.01)

(52) U.S. Cl.
CPC ...... *H01L 31/0224* (2013.01); *H01L 31/02168* (2013.01); *H01L 31/022433* (2013.01); *B82Y 30/00* (2013.01); *B82Y 40/00* (2013.01); *Y02E 10/50* (2013.01); *Y10S 977/762* (2013.01); *Y10S 977/932* (2013.01)

(58) Field of Classification Search
None
See application file for complete search history.

(56) References Cited

U.S. PATENT DOCUMENTS

| 2010/0044072 | A1  | 2/2010  | Wangt et al. |
| 2011/0287318 | A1* | 11/2011 | Loveness et al. ......... 429/218.1 |
| 2011/0303260 | A1* | 12/2011 | Lee et al. ................ 136/244 |
| 2012/0070741 | A1  | 3/2012  | Liu et al. |
| 2012/0199747 | A1* | 8/2012  | Letant et al. ............ 250/362 |

* cited by examiner

*Primary Examiner* — Alexander Ghyka
(74) *Attorney, Agent, or Firm* — Lumen Patent Firm

(57) ABSTRACT

A method of fabricating single-crystalline metal silicide nanowires for anti-reflective electrodes for photovoltaics is provided that includes exposing a surface of a metal foil to oxygen or hydrogen at an elevated temperature, and growing metal silicide nanowires on the metal foil surface by flowing a silane gas mixture over the metal foil surface at the elevated temperature, where spontaneous growth of the metal silicide nanowires occur on the metal foil surface, where the metal silicide nanowires are post treated for use as an electrode in a photovoltaic cell or used directly as the electrode in the photovoltaic cell.

14 Claims, 7 Drawing Sheets

METAL SILICIDE NANOWIRE ARRAYS FOR ANTI-REFLECTIVE ELECTRODES IN PHOTOVOLTAICS

CROSS-REFERENCE TO RELATED APPLICATIONS

This application claims priority from U.S. Provisional Patent Application 61/630,348 filed Dec. 9, 2011, which is incorporated herein by reference.

FIELD OF THE INVENTION

The present invention relates generally to nanowires. More particularly, the invention relates to using silicide nanowires to minimize reflection and ohmic losses in photovoltaic cells, while using low-cost and scalable manufacturing methods.

BACKGROUND OF THE INVENTION

Light management in photovoltaic cells is a critical area of research in order to minimize material utilization while achieving high efficiencies. By using 3-D nanostructured templates such as nanowires (NWs), the absorption length required to fully utilize the solar spectrum can be effectively decoupled from the carrier extraction length, which should be minimized to reduce recombination. Furthermore, light-scattering and trapping has been observed in 3-D architectures such as microwire, nanowire, and nanocone arrays, allowing for enhanced absorption and suppressed reflection. This permits the use of significantly less material than a planar architecture, and reduces the purity and morphological requirements of the absorber layer due to a decreased carrier extraction length. This is the principle employed in dye-sensitized solar cells (DSCs) and extremely-thin absorber (ETA) cells, which utilize a very thin absorber layer in conjunction with a nanostructured template.

Ultimately, the large-scale incorporation of photovoltaics as a renewable energy source will depend on the ability to drive down costs. While nanostructured architectures can provide several benefits for solar cells, the use of top-down processing techniques involving lithography and/or etching, or catalyst-mediated growth techniques, can add significantly to the manufacturing costs. Catalyst-based techniques can also lead to incorporation of impurities into the NWs, which can negatively affect their recombination properties.

There are a variety of growth techniques for nickel silicide NWs, most of which can be divided into three categories: delivery of silicon to nickel film, delivery of nickel to silicon NWs, and simultaneous delivery of silicon and nickel. Some new methods, such as point contact reaction between Si and Ni NWs were recently reported. Due to its simplicity and low cost, chemical vapor deposition of silane on nickel films, as the earliest discovered method, has been intensively studied.

The underlying mechanism for nanowire growth based on thermal decomposition of silane on Ni films is still a matter of debate. Nickel diffusion into silicon has been proposed by several groups, and the formation of NWs rather than films has been shown to be a strong function of temperature, pressure, and silane concentration. It has been proposed that a low supersaturation degree of the vapor-phase precursors can lead to the spontaneous formation of NWs rather than thin films, due to limited nucleation kinetics. The role of surface oxides on the growth has also been investigated, and it has been shown that the presence of surface oxide species can promote nanowire growth. The surface oxide layer can serve as either a Ni diffusion barrier, or as a catalyst for a vapor-liquid-solid (VLS) growth mechanism. However, the exact role of surface oxides on nanowire growth is not clear, and several reports have been presented without the purposeful introduction of oxygen.

What is needed is a low-cost and reduced complexity method of fabricating single-crystalline metal silicied nanowieres for anti-reflective electrodes for photovoltaic applications.

SUMMARY OF THE INVENTION

To address the needs in the art, a method of fabricating single-crystalline metal silicide nanowires for anti-reflective electrodes for photovoltaics is provided that includes exposing a surface of a metal foil to oxygen or hydrogen at an elevated temperature, and growing metal silicide nanowires on the metal foil surface by flowing a silane gas mixture over the metal foil surface at the elevated temperature, where spontaneous growth of the metal silicide nanowires occur on the metal foil surface, where the metal silicide nanowires are post treated for use as an electrode in a photovoltaic cell or used directly as the electrode in the photovoltaic cell.

According to one aspect of the invention, the metal foil includes an untreated Ni metal foil.

In another aspect of the invention, the elevated temperature is in a range of 300° C. to 500° C.

In a further aspect of the invention, the metal foil includes a layer of surface oxide species.

According to one aspect of the invention, the nanowires have a diameter in a range of 20 to 900 nm.

In yet another aspect of the invention, the nanowires have a length in a range of 1 to 30 µm.

According to another aspect of the invention, the silane gas mixture includes the silane gas and an inert gas.

In a further aspect of the invention, the elevated temperature includes using a tube furnace.

In one aspect of the invention, a diameter and spacing of the nanowires is controlled by varying a flow rate of a carrier gas species during formation of the nanowires.

According to another aspect of the invention, a metal of the metal silicide nanowires includes transition metal elements, where the metal elements can include Ni, Ti, Fe, Co, Cr, or Mn.

In a further aspect of the invention, post treating the metal silicide nanowires includes coating the metal silicide nanowires with single conformal layers of quantum dots using atomic layer deposition.

According to another aspect of the invention, the post treating the metal silicide nanowires includes coating the metal silicide nanowires with and ion-conducting electrolyte material, where the electrolyte material comprises a solid material or a liquid material.

In a further aspect of the invention, the fabrication of the metal silicide nanowires includes using roll-to-roll manufacturing.

In yet another aspect of the invention, the metal silicide nanowires are used in photoelectrochemical devices.

DETAILED DESCRIPTION

Figure 1:
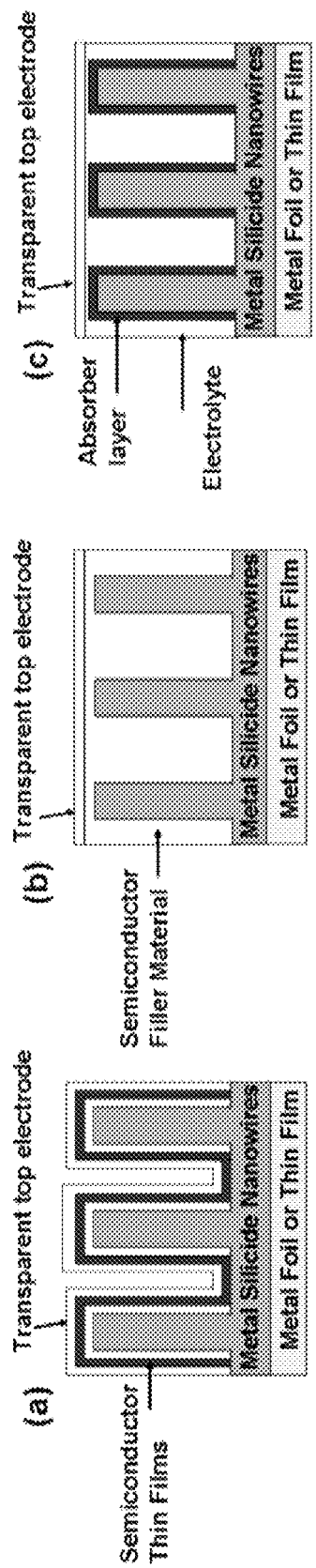
FIG. 1(a) shows a potential architecture employing metal silicide nanowires that includes nanowires coated with one or more layers of thin films, forming either an ohmic contact to a p-n junction or a shottky diode capable or separating generated charge carriers, according to one embodiment of the invention.
FIG. 1(b) shows the space between the nanowires is completely filled by one or more semiconductor absorber layers, and capped by a transparent top electrode, according to one embodiment of the invention.
FIG. 1(c) shows nanowires incorporated into a photoelectrochemical cell with an ion-conducting electrolyte material separating the two electrodes, according to one embodiment of the invention.

This current invention includes single-crystalline metal silicide nanowires as an electrode material for photovoltaics, which takes advantage of the favorable light-scattering and antireflection properties of these nanowires. According to one aspect of the invention, this type of nanowire minimizes reflection and ohmic losses in photovoltaic cells, while using low-cost and scalable manufacturing methods.

Light management in photovoltaic cells is a critical area of research in order to minimize material utilization while achieving high efficiencies. By using 3-D nanostructured templates such as nanowires (NWs), the absorption length required to fully utilize the solar spectrum can be effectively decoupled from the carrier extraction length, which should be minimized to reduce recombination, according to one aspect of the invention. Furthermore, light-scattering and trapping in 3-D architectures such as microwire, nanowire, and nanocone arrays, allows for enhanced absorption and suppressed reflection. This permits the use of significantly less material than a planar architecture, and reduces the purity and morphological requirements of the absorber layer due to a decreased carrier extraction length.

Many nanowire architectures have been explored for use in solar cells, which are mostly based on semiconductor materials such as Si or ZnO. In this case, the nanowire serves as a component of the junction as well as a current conduction path. While doping can lead to decreased resistivity values in these semiconducting NWs, the high aspect ratio geometries and small cross-sectional areas can contribute to the series resistance of the solar cell. Furthermore, by using the nanowire as a component in the p-n junction, the choice of compatible material systems is limited. In contrast, metallic NWs can provide significantly lower resistances by acting as the contact material, while potentially maintaining the same light-scattering benefits, and allowing for a wide variety of material combinations for the p-n junction by incorporating thin coating layers on the nanowire surface.

According to one embodiment of the invention, a photovoltaic cell architecture is provided that is based on metal silicide nanowire arrays as an electrode. These nanowires can be fabricated in a low-cost manner through thermal decomposition of silane on metal foil substrates, without the need for lithography, etching, or catalysts. The use of a flexible foil substrate allows for potential integration into large-scale production methods such as roll-to-roll processing. The optical properties of these nanowire arrays demonstrate excellent anti-reflection behavior, suggesting their use as a template for photovoltaic devices. The nanowires are highly conductive and single crystalline as deposited. The remainder of the solar cell can be fabricated by a variety of techniques which incorporate these metal silicide nanowires as an electrode material and benefit from their favorable optical properties.

The metal silicide nanowires can be incorporated into various architectures to serve as a component of a photovoltaic cell. In one embodiment, FIG. 1(a) shows the nanowire arrays serve as a metallic electrode material, which makes an ohmic contact to a semiconductor homojunction or heterojunction structure capable of generating electron-hole pairs and separating the charged species through the presence of a built in electric field. This can be in the form of a p-n junction of a single material, or a heterojunction or two different materials. In one embodiment, the nanowire electrode acts as the bottom electrode, and contributes to light scattering, reflection suppression, and acts as a current collector. Another electrode must be located on the top surface of the cell, which permits light to be transmitted and absorbed in the semiconductor materials. This can include a transparent conductive electrode material, or a metallic grid, which permits sufficient light to be transmitted to the cell. The NWs could also form a Schottky diode with a semiconductor material to facilitate charge separation.

In one aspect, the surface of the nanowires could be coated by a wide variety of methods and materials. An example architecture would involve one or more thin film coatings on the surface, which would conformally coat the surface. These layers could be deposited by vapor-phase deposition techniques such as chemical vapor deposition (CVD) or physical vapor deposition (PVD) techniques, atomic layer deposition (ALD), or liquid-phase techniques such as chemical bath deposition (CBD), sol-gel processing, or electrodeposition. In particular, ALD is an attractive technique for depositing conformal layers of a variety of thin films on high-aspect ratio structures.

In another embodiment, complete penetration of the spaces between the nanowires is provided with a material or a combination of materials, as shown in FIG. 1(b). This could be an organic polymer or inorganic material. One advantage of this embodiment is that the top electrode reduces fabrication complexity due to the formation of a more flat surface. However, charge recombination in the filler material could become an issue, as carriers would have to travel through the length of the material to the counter electrode, rather than simply through a thin film coating. In one aspect, this architecture could also incorporate nanoscale materials such as quantum dots as the filler material, which could allow for novel photovoltaic architectures capable of taking advantage of concepts such as hot carrier extraction, multiple exciton generation, or intermediate band devices. In another aspect, the architecture includes the incorporation of the metal silicide nanowire array into a photoelectrochemical device. In this iteration, an ion-conducting electrolyte material is used to coat the surface of the nanowires, and charge transfer at the electrode-electrolyte interface is facilitated through oxidation/reduction chemistry. This electrolyte could be a solid or liquid material. In the case of a liquid electrolyte, the potential difficulty of creating a conformal coating along the surface of the nanowires is reduced, as the liquid could easily penetrate into the space between the wires. In a further embodiment, light absorption could be accomplished through the use of organic dye materials, as in dye-sensitized solar cell architectures, or an inorganic absorber material. An example photoelectrochemical cell based on metal silicide nanowires is shown in FIG. 1(c).

According to one embodiment, the metal species in the metal silicide nanowire can also be varied depending on the application and material properties desired, such as conductivity, bandgap, work function and phase. Example metal species of interest for nanowires include Ni, Ti, Fe, Co, Cr, Mn, or other transition metal elements. The method of fabricating these nanowires can include delivery of silicon to the metal surface, delivery of the metal to silicon nanowires, or simultaneous delivery of silicon and the metal species. Of particular interest for low-cost manufacturing for photovoltaic applications is delivery of silane to a metal surface at elevated temperatures, leading to the spontaneous decomposition of silane and formation of nanowires. For example, $Ni_xSi$ nanowires fabricated by this method have demonstrated broadband suppression of reflection to levels below 1% from 350 nm to 1100 nm, which is among the highest values reported for nanowires. A reduced-complexity technique has been demonstrated to control the diameter and spacing of these nanowires through varying the flow rate of a carrier gas species. These nanowires are single-crystalline and highly conductive suggesting their use as an efficient electrode material for nanostructured solar cells with favorable light scattering properties.

The current invention can be used for photovoltaic cells, photoelectrochemical cells, and optoelectronic devices Use of metal silicide nanowires has several advantages over other nanowire solar cell architectures. Because these nanowires are highly conductive, single-crystalline, and have demonstrate excellent antireflection properties over a broad range of wavelengths, they can be fabricated through various low-cost methods, including thermal decomposition of silane gas on metal foil substrates. This allows for potential integration into large-scale manufacturing processes such as roll-to-roll manufacturing, which can drive down the device costs. The use of metallic nanowires instead of semiconductor nanowires also allows for greater flexibility in material selection for the cell, as the wires can serve as an electrode material rather than a component of the p-n junction. Other advantages include light scattering and reflection suppression, which allows for efficient absorption of light, and enables lower cost and purity materials due to a decreased diffusion length. The high conductivity and single crystalline phase of these materials allows for charge transport with minimal ohmic losses. A wide variety of material combinations can be facilitated through the use of the nanowires as ohmic or Schottky contacts. Further, low cost manufacturing techniques, such as thermal decomposition of silane on flexible metal foil substrates removes the need for lithography, etching, or catalysts to create antireflective nanowire templates.

The nanowires can be used as an ohmic contact material for thin-film coating layers which form a p-n junction. Alternatively, the wires can be used as a contact material to form a Shottky diode. The light absorbing material can be thin films, nanoparticles, quantum confined structures (quantum wells, quantum dots), or a "filler" material used to completely penetrate the space between the wires. The wires could also be used in photoelectrochemical cells, in which an electrolyte material is present facilitating ionic transport from one electrode to the other.

The use of metal silicide nanowires as an electrode in photovoltaic or photoelectrochemical cells, the use of the thermal decomposition of silane on metal foils to fabricate a low-cost photovoltaic electrode structure, and the use of atomic layer deposition as one iteration to coat the nanowires with a conformal thin layer are all new.

In one embodiment of the current invention highly-conductive (~$10^{-4}$ Ω-cm), single-crystalline $Ni_xSi$ NWs are grown on flexible metal foil substrates in a completely bottom-up manner, without the need for lithography, etching or catalysts. The nanowire arrays exhibited excellent broadband anti-reflection properties, with reflection levels of less than 1% in the visible and NIR wavelengths, which is among the highest reported values for NWs. The ability to fabricate highly anti-reflective and conductive single-crystalline NWs on a low-cost and flexible substrate without any pre-patterning steps represents a powerful combination of properties to address many of the challenges associated with large-scale manufacturing of nanowire solar cells.

In one exemplary embodiment of the invention, NWs are grown after first exposing the nickel surface to either oxygen or hydrogen at elevated temperatures, suggesting that nanowire growth is possible under a variety of surface oxidation conditions. Furthermore, a method to control the nanowire diameter and density is demonstrated by varying the carrier gas flow rate after first reducing the surface oxide species in the presence of hydrogen, which removes the uncertainty of $NiO_x$ surface morphology on nanowire size.

In the current embodiment $Ni_xSi$ NWs were grown on Ni foil substrates in a tube furnace. The tube was purged with high purity argon or other inert gas, and pumped down to a base pressure of $10^{-3}$ Torr prior to the deposition. The oxidized Ni surface was either left untreated, or reduced in hydrogen at 450° C. for 30 min to remove the surface oxide species. NWs were grown by flowing a low-concentration silane gas mixture (0.84% in argon) at a temperature of 450° C. for 30 min, where other inert gases may be used. The use of this low-concentration gas mixture is below the flammability limit of silane, which could further reduce cost and safety issues in manufacturing settings. Additionally, hydrogen was used as a carrier gas in some experiments involving reduced surfaces, to study the effect of carrier gas flow rate on NW size and density.

Figure 2:
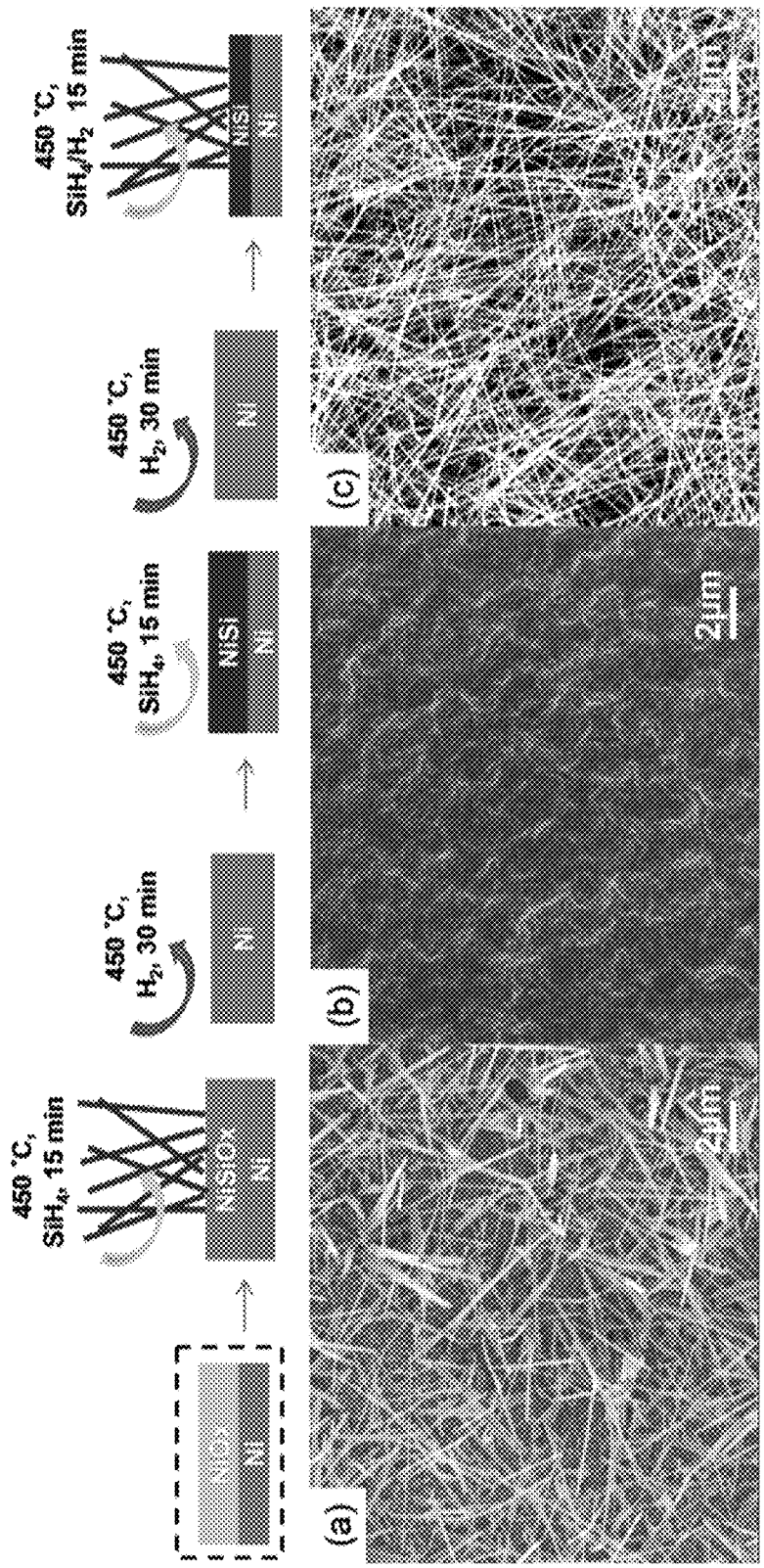
FIG. 2(a)-2(c) show schematics of nanowire growth routes and corresponding SEM images. (a) Nanowire growth on an oxidized Ni surface (b) Thin film growth on a reduced Ni surface without additional carrier gas (c) Nanowire growth on a reduced Ni surface with the introduction of an additional carrier gas, according to embodiments of the invention.

The method used to fabricate NWs in the current embodiment was to flow the silane gas mixture over untreated Ni surfaces, which have a thin layer of surface oxide species present due to air exposure. Spontaneous growth of NWs was observed on the Ni foil surface. SEM images of NWs growth by this technique are shown in FIG. 2(a). The NWs had diameters ranging from 20 to 900 nm, and lengths of 1-30 μm. Surface oxide species can be beneficial in the growth of single crystal $Ni_xSi$ NWs, due to limited diffusion of Ni through the $NiO_x$ layer. Additionally, the formation of $NiSi_xO_y$ species on the surface is considered as another contributing factor to nanowire nucleation and size. The non-uniform diameters and density across the foil surface of the NWs might therefore be attributed to a variation in the size and density of the surface oxide species, which were grown by an uncontrolled oxidation process in air, and could be affected by the polycrystalline surface morphology of the Ni foils.

To show the importance of surface oxides on nanowire growth, Ni foils were pre-treated by annealing the samples in hydrogen environment at 450° C. for 30 minutes to reduce the surface and eliminate the surface oxide species. As shown in FIG. 2(b), this resulted in the formation of a dense film rather than NWs, which further demonstrates that surface oxide species are beneficial in nanowire growth. However, when a stream of hydrogen gas was introduced as a carrier gas at the same time as the silane, NWs formed even after an initial surface reduction, as shown in FIG. 2(c). This suggests that an alternate mechanism which is not dependent on the presence of oxygen species could allow for nanowire growth. The exact mechanism of nanowire nucleation and growth under these conditions could be affected by mass transport of the reactant species to the surface, as well as chemical kinetics of the growth process. The mass transport of silane through the surface boundary layer will be affected by an increase in the overall reactor pressure due to the introduction of the hydrogen gas stream, as well as the increased gas velocity. Also, the introduction of hydrogen can affect the equilibrium concentration of decomposed silane byproducts on the Ni surface, affecting the kinetics of the growth process. Both of these factors could lead to a decreased supersaturation degree of the $SiH_4$ at the nickel surface, leading to limited nucleation kinetics despite the high Ni concentration of a reduced surface.

Furthermore, the uniformity of the nanowire diameters shown in FIG. 2c was significantly improved compared to the reaction with the oxidized surface. Reducing the surface before introducing silane removes the uncertainty in the oxidation state of the Ni foil, and allows for a repeatable mechanism to form NWs with a uniform size distribution. While the use of a low-cost and flexible foil substrate has many potential advantages for large-scale photovoltaic manufacturing, the rough and polycrystalline surface could lead to concerns over the uniformity of nanowire growth based on surface oxidation. The use of a reduced surface leads to a repeatable standard, which is less complex to generate and results in a uniform size distribution of wires.

Figure 3:
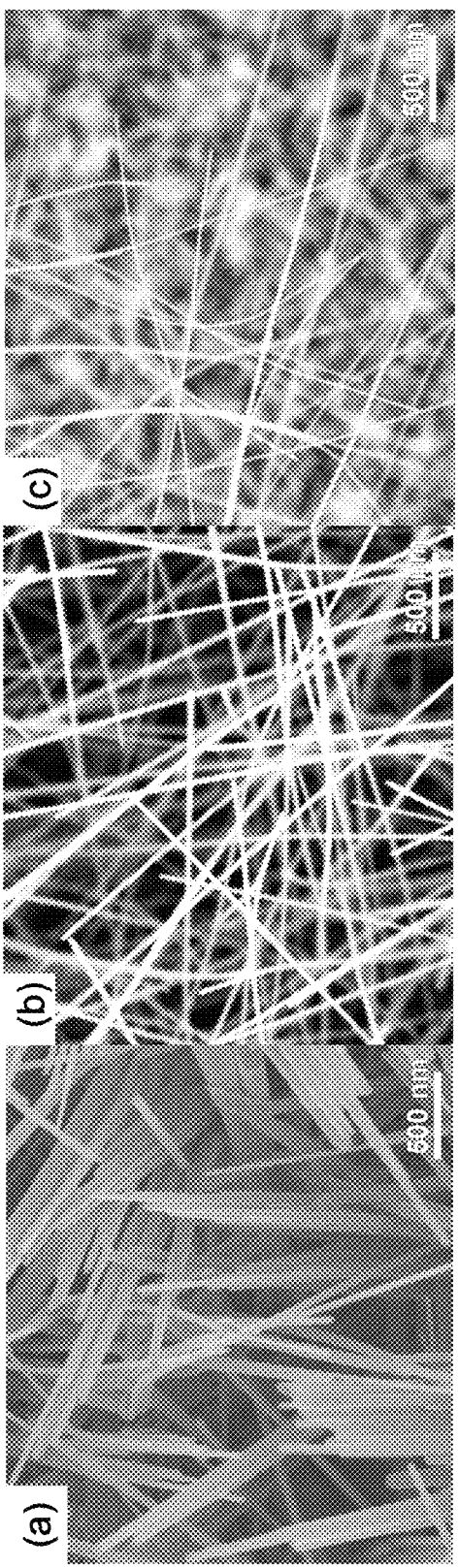
FIGS. 3(a)-3(c) show SEM images of NWs grown with varying hydrogen flow rates of (a) 50 sccm (b) 100 sccm and (c) 200 sccm, according to one embodiment of the invention.

In addition to improved uniformity of the diameter of NWs after surface reduction, by varying the flow rate of the carrier gas, the average diameter and density of the NWs can also be controlled. FIGS. 3(a)-3(c) show NWs grown by maintaining a constant flow rate of 100 sccm for the silane gas mixture, and varying the flow rate of the argon carrier gas from 50 to 200 sccm. By increasing the flow rate of the carrier gas, the average diameter of the NWs can be controllably reduced. Along with a reduction in nanowire diameter, the density of the NWs also decreased with increasing flow rate. This has important implications for photovoltaics based on a nanowire template, as the diameter and spacing of the wires will have an effect on the optical scattering of photons, as well as on the ability to penetrate into the nanowire array with a conformal surface coating. Therefore, depending on the deposition technique used to coat the NWs, there may be a tradeoff in effective light scattering with ability to fully penetrate into the film. One powerful technique to address this challenge is Atomic Layer Deposition (ALD), which has the ability to uniformly coat very high aspect ratio features in nanoporous substrates due to its self-limiting surface chemistry. For example, this has been used to penetrate nanoporous templates based on dye-sensitized architectures. NWs coated with single layers of PbS quantum dots using ALD has been demonstrated, enabling fabrication of next-generation photovoltaic architectures on high-aspect ratio NW templates.

Figure 4:
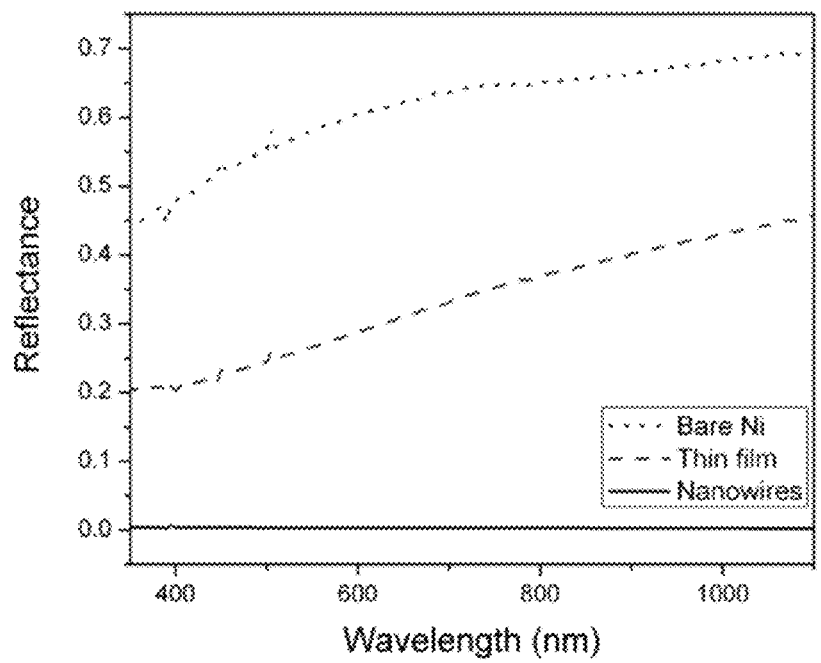
FIGS. 4(a)-4(b) show (a) Reflectance data measured by an integrating sphere, showing a decrease in reflectance from the bare Ni foil, to the thin film, to the nanowire arrays (b) photograph of the three samples shown in the reflectivity data, showing a dramatic decrease in reflectivity of the nanowire sample.
Figure 4:
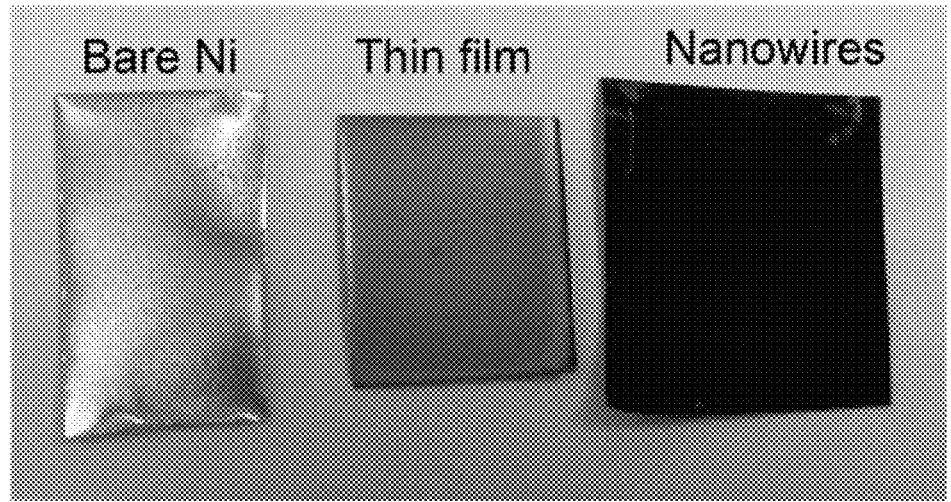

The ability to fabricate single-crystalline $Ni_xSi$ NWs on Ni foil substrates provides a reduced complexity and potentially low-cost solution to creating anti-reflective electrodes for photovoltaics. FIG. 4(b) shows photographs of the bare Ni foil, a thin film grown on a reduced foil surface without additional carrier gas, and $Ni_xSi$ NWs grown by a combination of silane and hydrogen on reduced surfaces. The growth of NWs led to a dramatic decrease in the surface reflectivity, and the samples appeared black, suggesting efficient reduction of surface reflectance due to light scattering from the NWs. To quantify the anti-reflection properties of these wires, a silicon photodetector was used in conjunction with an barium sulfate coated integrating sphere and a calibrated, monochromated light source to measure the total reflectivity. The sample was placed in the middle of the integrating sphere, and an angle of incidence of ~10° was maintained relative to normal to minimize specular reflection through the small entrance to the sphere where the light source entered.

The reflectance of the three samples is shown in FIG. 4(a). The bare Ni foil was highly reflective, with a reflectance varying from 45-70% in the wavelength range of 350-1100 nm. The thin film exhibited a lower reflectance than the metal surface, but still exhibited significant reflectivity in the visible wavelengths. The nanowire sample exhibited excellent anti-reflection properties, with less than 1% reflection measured across the range of wavelengths considered. As the transmission through the thick Ni foil was negligible, this represents greater than 99% absorption in this nanowire array, which is among the highest reported values for nanostructured templates. This is particularly remarkable, given the random orientation of the nanowires, as ordering of the nanowires has been shown to be beneficial for light trapping. While this random orientation may make penetration of the films difficult for line-of-sight deposition techniques, processes such as ALD uniformly coat these structures. The excellent anti-reflection properties of these metallic nanowire arrays could allow for such ultra-thin coatings to be applied using a variety of material systems to facilitate carrier generation and separation, while minimizing material utilization and the diffusion length associated with charge separation.

In addition to excellent reflection suppression, the use of $Ni_xSi$ nanowire arrays has a significant advantage as an electrode material due to the metallic nature of the wires. Pure NiSi NWs grown by deposition of Ni metal onto single-crystal Si NWs were measured to have a resistivity of about $10^{-5}$ $\Omega$-cm[18]. While the NWs grown were also single-crystalline, the variations in stoichiometry and phase may lead to a reduction in conductivity. To quantify the resistivity of these NWs, the I-V spectrum of a single wire grown by the reduced-surface route was measured using a 2-point method. Ni electrodes were patterned by traditional photolithography, and a single nanowire was transferred to the electrodes using an omniprobe transfer method in a Focused Ion Beam (FIB) system and attached using ion-beam induced deposition of Pt (see supporting information). A Source Measure Unit (SMU) was used in conjunction with DC microprobes to determine the I-V characteristics of the single nanowire.

Figure 5:
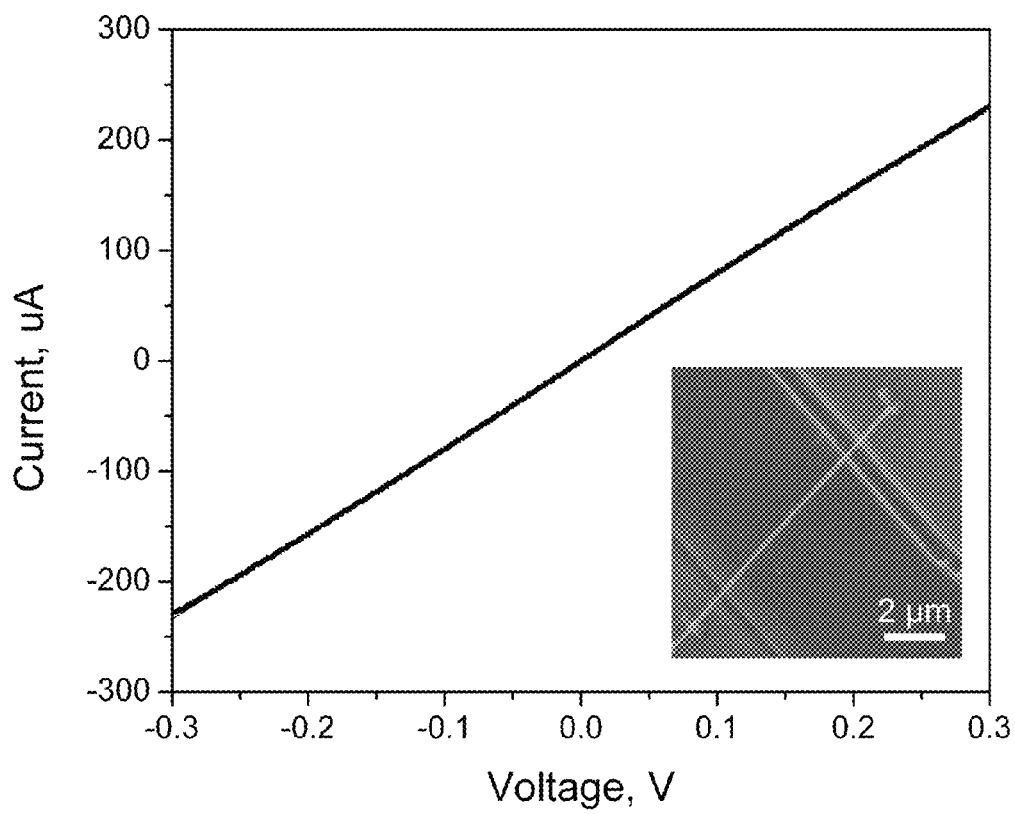
FIG. 5 shows current vs. voltage profile of a single nanowire contacted by two Ni electrodes, as shown in the SEM image in the insert, according to one embodiment of the invention.

FIG. 5 shows a linear I-V behavior of the nanowire, with a resistance of 1285$\Omega$. The nanowire diameter was measured to be 80 nm with a 6 µm gap between the electrodes. The lead resistance of the electrodes was measured to be 2.62$\Omega$, so neglecting this effect the nanowire resistivity was calculated to be $1.07 \times 10^{-4}$ $\Omega$-cm. This is likely to be an upper limit to the actual nanowire resistivity, as contact resistances may have contributed further to the signal, especially since any surface oxidation of the nanowire was not removed prior to measurement. The combination of this high conductivity and low reflectivity based on such a bottom-up fabrication scheme presents a powerful combination of characteristics for large-scale photovoltaic electrode manufacturing.

Figure 6:
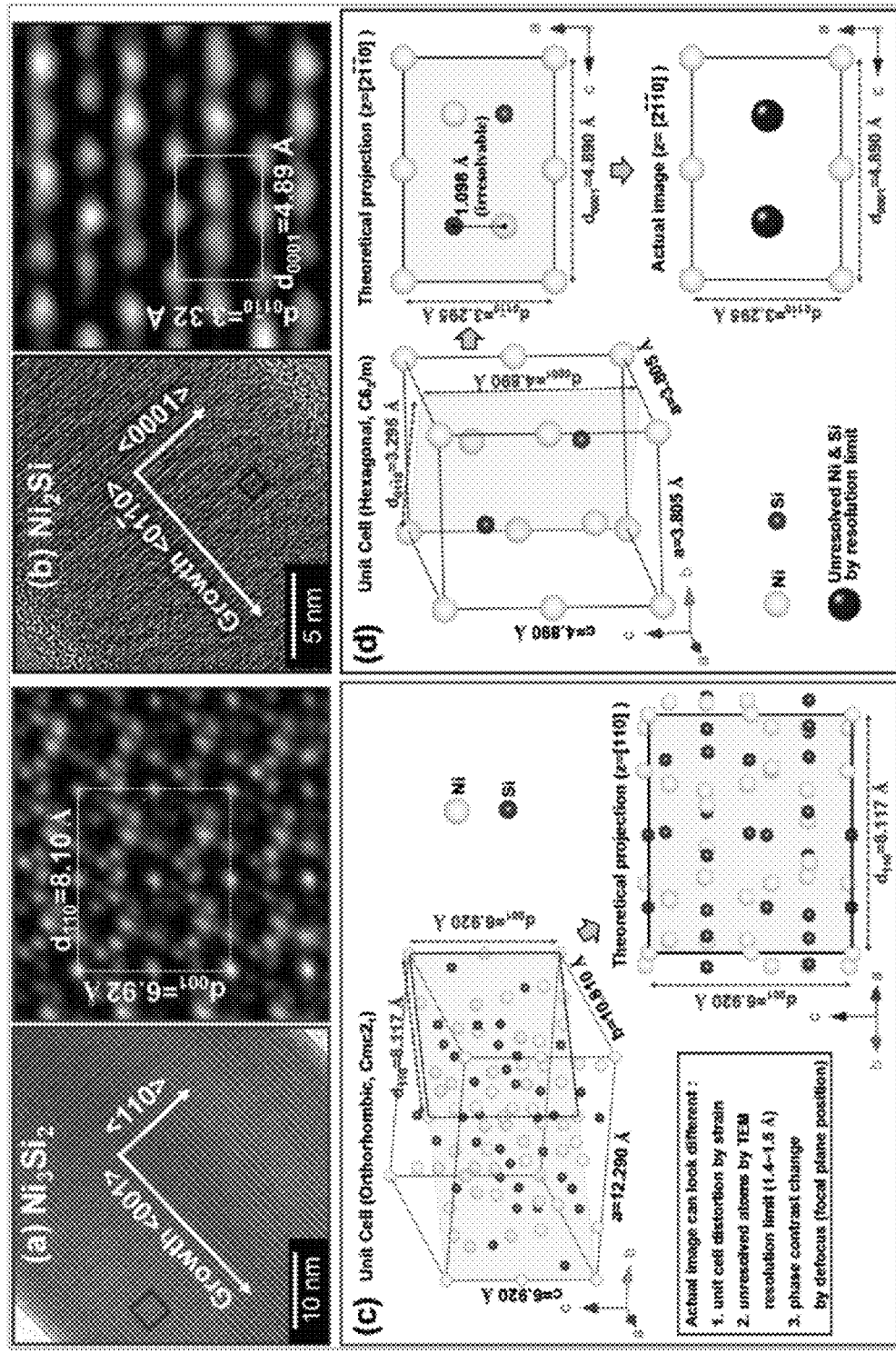
FIGS. 6(a)-6(d) show HRTEM images and theoretical projection analyses of two different NWs. The phase observed was $Ni_3Si_2$ (a & c) and $Ni_2Si$ (b & d). Each right side TEM image is digitally enlarged from the boxed region on each left side image. The theoretical projection of Ni and Si atoms in different zone axis orientations (z=[110] for $Ni_3Si_2$ (b) and z=[2$\overline{1}\overline{1}$0] for $Ni_2Si$ (d)) are generated from multiple arrays of 3D unit cell, according to one embodiment of the invention.

In order to study the crystallographic and chemical properties of the NWs, high-resolution transmission electron microscopy (HRTEM) analysis was performed using a FEI 80-300 Titan operated at an accelerating voltage of 300 kV for the left side image and a FEI Tecnai G2 F20 X-TWIN operated at an accelerating voltage of 200 kV for the right side image. HRTEM images of two different NWs show single-crystalline orthorhombic $Ni_3Si_2$ in the [110] zone orientation in FIG. 6(a) and single-crystalline hexagonal $Ni_2Si$ in the [2$\bar{1}\bar{1}$0] zone orientation in FIG. 6(b). The measured interplanar d-spacings of $Ni_3Si_2$ ($d_{001}$=6.92 Å, $d_{110}$=8.10 Å) and $Ni_2Si$ ($d_{01\bar{1}0}$=3.32 Å, $d_{0001}$=4.89 Å) are consistent with the calculated d-spacings of $Ni_3Si_2$ ($d_{001}$=6.920 Å, $d_{110}$=8.117 Å) and $Ni_2Si$ ($d_{01\bar{1}0}$=3.295 Å, $d_{0001}$=4.890 Å) from previously reported values[29-31] [$Ni_3Si_2$ (a=12.290 Å, b=10.810 Å, c=6.98 Å, orthorhombic, $Cmc2_1$), $Ni_2Si$ (a=4.890 Å, c=3.295 Å, hexagonal, $C6_3/m$)]. For visualization purposes, the theoretical projection of these two crystal structures are shown in FIG. 6(c) and FIG. 6(d), respectively.

The resemblance of the projected structure and the image for $Ni_2Si$ is quite good, but clearly the $Ni_3Si_2$ structure is more complex. Many factors contribute to discrepancies between the theoretical and measured crystal structures. One important influence is that the measured lattice parameter changes slightly along the length of the wire. This can induce some strain and distortion of the lattice, which can lead to differences in theoretical projections of the atomic positions and the actual HRTEM images. Additionally, differences in measured and theoretical values can stem from unresolved Ni and Si atoms due to the resolution limit of the TEM (1.4~1.5 Å at 200 kV e-beam acceleration), as well as from phase contrast change by defocus (focal plane position on the TEM sample) and local thickness variation.

Figure 7:
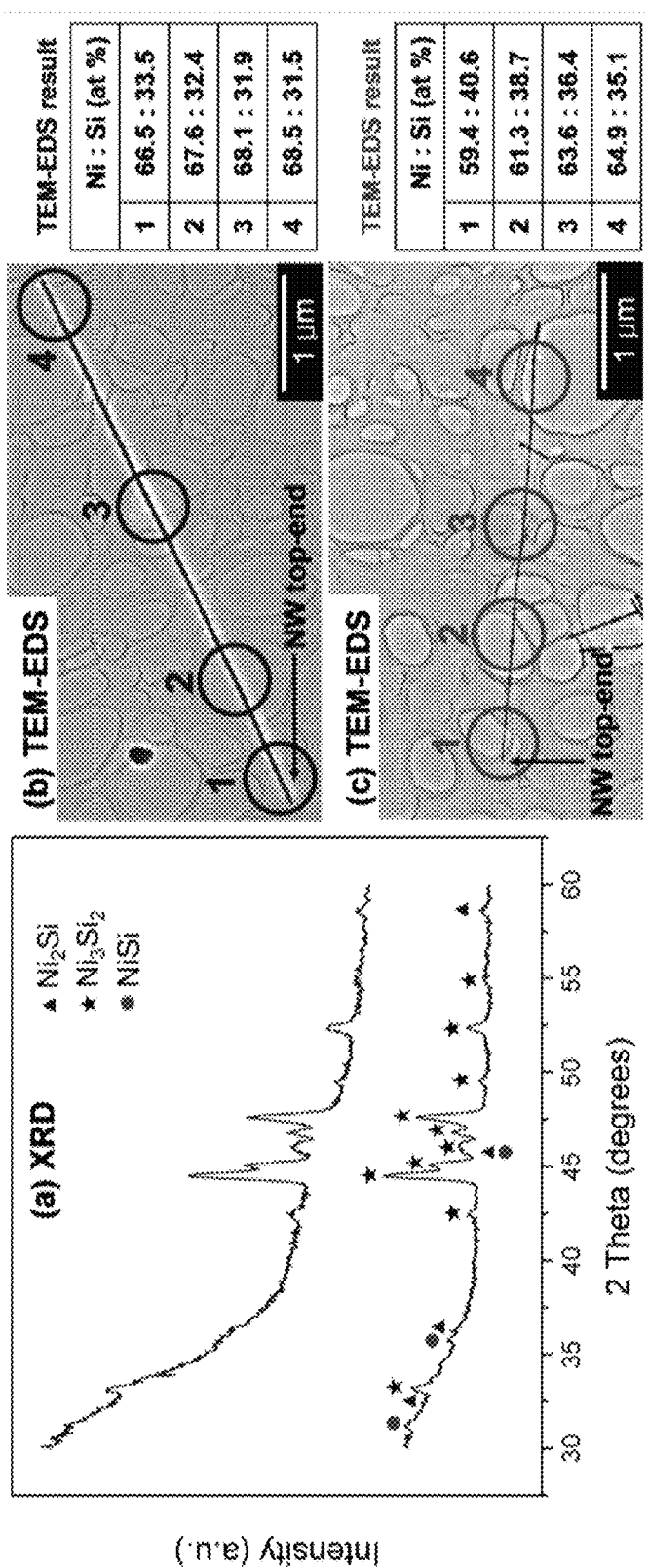
FIGS. 7(a)-7(c) show XRD spectra of NWs growth on (top) oxidized and (bottom) reduced Ni surfaces in (a), and TEM-EDS results from local regions (circles) on different NWs in (b) and (c), according to one embodiment of the invention.

To further study the phases present in the NWs, x-ray diffraction (XRD) and TEM-EDS (energy dispersive spectroscopy) were performed. To prepare the samples for XRD analysis, the foil-nanowire samples were immersed in toluene and placed in an ultrasonic bath to detach the NWs from the foil surface. This nanowire solution was subsequently drop cast onto glass slides, and the toluene was evaporated leaving an ensemble of NWs on the glass surface. By performing XRD on these samples, the phases present in a large ensemble of wires could be studied without any background signal from the foil substrate. The results of the XRD scans for NWs grown the oxidized and reduced Ni foil surfaces are shown in FIG. 7(a). Several phases were observed in the XRD spectra, with the most notable phase being orthorhombic $Ni_3Si_2$. Additionally, orthorhombic NiSi and hexagonal $Ni_2Si$ peaks were observed. The XRD spectrum for NWs grown the oxidized and reduced surface were similar, suggesting that the nanowire phase was not strongly dependent on the surface pre-treatment.

To study the chemical composition of the wires, local EDS spectra (diameter~500 nm) were measured at various points of two different NWs, as indicated by the circled regions in FIG. 7(b) and FIG. 7(c). As shown in the TEM-EDS analysis (see supporting information), the chemical composition of the NWs changes 2~5% along the length of the wire with Ni content decreasing in the growth direction, presumably due to Ni diffusion from the foil into the nanowire. This could lead to a phase variation (i.e. structure change by lattice strain) within a single NW along the length of the wire, although the wires appeared to be single-crystalline in the HRTEM images. Energy-filtered TEM (EFTEM) images for Ni and Si atoms confirm that the majority of the regions in the NW show a very uniform concentration profile. However, a few selective regions show an abrupt change of Ni and Si concentration, which may be the point of a phase variation. This variation in phase and composition along the wire could have implications for the conductivity of the wires, as the electron mobility will also likely vary along the length of the wire.

The ability to fabricate metallic, single crystalline NWs on low-cost and flexible metal foil substrates is a powerful technique for electrode fabrication. In this example, a method is introduced to repeatably prepare the surface of Ni foils for $Ni_xSi$ nanowire growth by reduction in a hydrogen environment, followed by introduction of silane with an additional carrier gas. The diameter and density of the wires can be easily controlled by varying the carrier gas flow rate. The nanowire arrays demonstrate excellent anti-reflection properties, and high electrical conductivity ($10^{-4}$ Ω-cm) suggesting their use as a light-scattering electrode for photovoltaics. The combination of high conductivity, excellent light-scattering properties and a simple, bottom-up fabrication make this an attractive template for a variety of 3-D photovoltaic architectures.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed:

1. A method of fabricate single-crystalline metal silicide anti-reflective and light trapping photovoltaic nanowire current collector electrodes, comprising:
   a) exposing a planar surface of a metal foil photovoltaic substrate to oxygen or hydrogen at an elevated temperature; and
   b) growing anti-reflective and light trapping metal silicide nanowires on said planar metal foil photovoltaic substrate surface by flowing a silane gas mixture over said planar metal foil surface at said elevated temperature, wherein spontaneous growth of said anti-reflective and light trapping metal silicide nanowires occurs outward from said planar metal foil photovoltaic substrate surface, wherein said anti-reflective and light trapping metal silicide nanowires are post treated for implementation as a current collector electrode in a photovoltaic cell, wherein said post treated anti-reflective and light trapping silicide nanowires are arranged away from said planar metal foil to form a metallic anti-reflective and light trapping photovoltaic current collector electrode, wherein said photovoltaic cell comprises a transparent electrode, a semiconductor material, said metallic anti-reflective and light trapping silicide nanowires and said metal foil.

2. The method of claim 1, wherein said metal foil comprises an untreated Ni metal foil.

3. The method of claim 1, wherein said elevated temperature is in a range of 300° C. to 500° C.

4. The method of claim 1, wherein said metal foil comprises a layer of surface oxide species.

5. The method of claim 1, wherein said nanowires have a diameter in a range of 20 to 900 nm.

6. The method of claim 1, wherein said nanowires have a length in a range of 1 to 30 μm.

7. The method of claim 1, wherein said silane gas mixture comprises said silane gas and an inert gas.

8. The method of claim 1, wherein said elevated temperature comprises using a tube furnace.

9. The method of claim 1, wherein a diameter and spacing of said nanowires is controlled by varying a flow rate of a carrier gas species during formation of said nanowires.

10. The method of claim 1, wherein a metal of said metal silicide nanowires comprises transition metal elements, wherein said metal elements are selected from the group consisting of Ni, Ti, Fe, Co, Cr, and Mn.

11. The method of claim 1, wherein said post treating said metal silicide nanowires comprises coating said metal silicide nanowires with single conformal layers of quantum dots using atomic layer deposition.

12. The method of claim 1, wherein said post treating said metal silicide nanowires comprises coating said metal silicide nanowires with and ion-conducting electrolyte material, wherein said electrolyte material comprises a solid material or a liquid material.

13. The method of claim 1, wherein said fabrication of said metal silicide nanowires comprises using roll-to-roll manufacturing.

14. The method of claim 1, wherein said metal silicide nanowires are used in photoelectrochemical devices.

* * * * *